US011170710B2

(12) United States Patent
Hsieh et al.

(10) Patent No.: US 11,170,710 B2
(45) Date of Patent: Nov. 9, 2021

(54) DISPLAY MODULE WITH HIGH RESOLUTION GRAYSCALE, DISPLAY DEVICE, AND DRIVING METHOD THEREOF

(71) Applicant: AU OPTRONICS CORPORATION, Hsin-Chu (TW)

(72) Inventors: Hsiang-Yuan Hsieh, Hsin-Chu (TW); Min-Yao Lu, Hsin-Chu (TW); Ming-Chen Hsu, Hsin-Chu (TW); Chin-Tang Chuang, Hsin-Chu (TW)

(73) Assignee: AU OPTRONICS CORPORATION, Hsin-Chu (TW)

( * ) Notice: Subject to any disclaimer, the term of this patent is extended or adjusted under 35 U.S.C. 154(b) by 0 days.

(21) Appl. No.: 16/837,556

(22) Filed: Apr. 1, 2020

(65) Prior Publication Data

US 2020/0349885 A1   Nov. 5, 2020

(30) Foreign Application Priority Data

May 1, 2019   (TW) ................. 108115178

(51) Int. Cl.
  *G09G 3/3216* (2016.01)
  *H01L 27/32* (2006.01)
  *G06F 3/14* (2006.01)
(52) U.S. Cl.
  CPC ......... *G09G 3/3216* (2013.01); *G06F 3/1446* (2013.01); *H01L 27/3281* (2013.01);
  (Continued)
(58) Field of Classification Search
  CPC ......... G09G 2310/0221; G09G 2/3208; G09G 3/3208; G06F 3/1446
  See application file for complete search history.

(56) References Cited

U.S. PATENT DOCUMENTS 6,618,031 B1   9/2003 Bohn, Jr. et al.
2004/0233125 A1   11/2004 Tanghe et al.
(Continued)

FOREIGN PATENT DOCUMENTS

CN   202033976 U   11/2011
CN   106486052 A   3/2017
(Continued)

OTHER PUBLICATIONS

TIPO has issued the Office Action for the corresponding Taiwan application dated Sep. 28, 2020.
(Continued)

*Primary Examiner* — Laurence J Lee
*Assistant Examiner* — Larry Lee
(74) *Attorney, Agent, or Firm* — WPAT, PC

(57) ABSTRACT

A display module including display pixels, driving circuit and first switches is provided. The display pixels are arranged in columns and rows in the display area, and every display pixel includes sub-pixels. The display pixels form pixel rows along the first direction, and the sub-pixels of the display pixels form sub-pixel columns along the second direction. The color of the light emitting from the sub-pixels of the same sub-pixel column are substantially the same. The first direction and the second direction are substantially perpendicular. The driving circuit includes signal connectors, and every signal connector connects one of the pixel rows. The first switch is connected between a power source and one of the pixel rows, transmitting driving signal. The first switch is controlled by the driving circuit. A display device and a driving method are also provided.

20 Claims, 5 Drawing Sheets

(52) U.S. Cl.
CPC ............... *G09G 2310/0221* (2013.01); *G09G 2310/0235* (2013.01); *G09G 2330/02* (2013.01)

(56) References Cited

U.S. PATENT DOCUMENTS

| | | | |
|---|---|---|---|
| 2008/0007495 A1* | 1/2008 | Kawashima | G09G 3/3216 345/80 |
| 2008/0079705 A1 | 4/2008 | Yang et al. | |
| 2015/0154904 A1 | 6/2015 | Lin et al. | |
| 2017/0220310 A1* | 8/2017 | Hochman | G09G 5/006 |
| 2019/0147793 A1* | 5/2019 | Valentine | G09G 3/3208 345/691 |
| 2019/0259324 A1 | 8/2019 | Liu et al. | |

FOREIGN PATENT DOCUMENTS

| | | | | |
|---|---|---|---|---|
| CN | 107993613 A | * | 5/2018 | ........... G09G 3/3225 |
| CN | 107993613 A | | 5/2018 | |
| CN | 109637414 A | | 4/2019 | |
| TW | 201106314 | | 2/2011 | |
| TW | 201523559 A | | 6/2015 | |
| WO | 2010151477 A2 | | 12/2010 | |

OTHER PUBLICATIONS

CNIPA has issued the Office Action for the corresponding China application dated Oct. 12, 2020.
CNIPA has issued the Office Action for the corresponding China application dated May 17, 2021.

\* cited by examiner

DISPLAY MODULE WITH HIGH RESOLUTION GRAYSCALE, DISPLAY DEVICE, AND DRIVING METHOD THEREOF

BACKGROUND OF THE INVENTION

1. Field of the Invention

The present disclosure relates to a display module, a display device, and the driving method thereof. In particular, it relates to a display module and a display device formed by active light emitting display pixels and the driving method thereof.

2. Description of the Prior Art

Along with the development of technology, the development of display technology sequentially contributed to flat cathode-ray tube display, plasma display, liquid crystal display, organic light-emitting diode (OLED) display, mini light-emitting diode display and micro light emitting diode display. Among which, organic light-emitting diode display, mini light-emitting diode display and micro light-emitting diode display have become the development main stream due to their advantages of high response speed, high color reproducibility, light weight, thinness, power saving and wide viewing angle.

Along with the prevalence of digital image signal, the aforementioned display devices further become the market main stream. The aforementioned organic light-emitting diode, mini light-emitting diode and micro light-emitting diode are active light-emitting diodes and current driven. The control of the grayscale is determined by the intensity of the current entering the active light-emitting element. Since these active light-emitting elements have only two statuses, which are bright or dark, the gray scale of each pixel is controlled by the length of the illumination time within the display time of each pixel in a frame; that is, these light-emitting elements are controlled by pulse width modulation (PWD) signals.

In particular, the current driving method includes time ratio grayscale simultaneous erasing scan (TRG-SES) and time ratio grayscale multiple addressing sequence (TRG-MAS). However, taking TRG-SES for example, PWM is merely controlled by dividing a frame into a plurality of sub-frames, and will be limited to addressing the frequency of gate driver, which further limits the number of drivable grayscales. Taking TRG-MAS for example, though each sub-frame has the time of a whole frame for addressing, drivable resolution or the number of drivable grayscales will also be limited in order to avoid being addressed at the same time. Therefore, to produce a display device which provides high resolution grayscale and the method of driving the display module is still a topic to be explored.

SUMMARY OF THE INVENTION

The present disclosure provides a display module and a display device, which may provide a display screen with high resolution grayscale.

The present disclosure provides a driving method, which may enable the display module or the display device to provide a display frame with high resolution grayscale.

The display module of the embodiment of the present disclosure includes a plurality of display pixels, a driving circuit and a plurality of first switches. The plurality of display pixels are arranged in columns and rows in the display area, and each of the plurality of display pixels includes a plurality of sub-pixels.

The plurality of display pixels are arranged along a first direction to form a plurality of pixel rows; the plurality of display pixels are arranged along a second direction to form a plurality of pixel columns. Each of the pixel columns comprises a plurality of sub-pixel columns, and the sub-pixels of the plurality of display pixels are arranged along the second direction to form a plurality of sub-pixels columns. Lights emitted by the plurality of sub-pixels of each of the sub-pixels columns are substantially same in color. The first direction and the second direction are substantially perpendicular.

The driving circuit includes a plurality of signal connectors, and each of the pixel columns is connected to one of the signal connectors. Each of the first switches is connected between a power source and one of the pixel rows to transmit a driving signal, and the driving circuit controls the first switches.

When the driving circuit enables one of the first switches, and one of the display pixels of the pixel rows connected to the one of the first switches receives a driving signal, the driving signal is transmitted between a power source and one of the signal connectors along the pixel columns in which one of the display pixels is arranged.

The display device in the embodiment of the present disclosure is configured to provide a screen. The display device includes the plurality of display modules. The display areas of the plurality of display modules constitute the screen provided by the display device, and the driving circuits of the plurality of display modules are connected to each other.

The driving method in the embodiment of the present disclosure is configured to drive the display modules. The method includes: transmitting the first gate signal at a first frequency; using the first gate signal to turn on a plurality of first switches in the display module; and controlling the transmission of driving signal in a plurality of sub-pixel columns at a second frequency while each of the first switches is turned on.

As mentioned above, the display module in the present disclosure may provide a screen using a plurality of display pixels in the display area through the driving circuit. The display devices provided by the present disclosure form the screen through a plurality of display areas provided by the plurality of display modules. The driving method of the present disclosure enables the display modules or the display devices to provide a display screen with high resolution grayscale.

DETAILED DESCRIPTION OF THE PREFERRED EMBODIMENT

The display module, display device, and driving method thereof in the present disclosure may be used in, for example, automotive displays, portable electronics, microdisplays, head mounted displays (HMD), monitors of notebook computers or desktop computers, wall-mounted TVs, etc. and the present disclosure is not limited to the aforementioned application fields. On the other hand, the display module, the display device, and the driving method thereof provided by the present disclosure are also not limited to the function of providing a display screen. People skilled in the art may further implement the display module, the display device, and the driving method thereof provided by the present disclosure as backlight modules and backlight devices for local dimming. Embodiments of the display module, the display device, and the driving method thereof are described as examples in the following paragraphs.

It should be understood that, even though the terms such as "first", "second", "third" may be used to describe an element, a part, a region, a layer and/or a portion in the present specification, but these elements, parts, regions, layers and/or portions are not limited by such terms. Such terms are merely used to differentiate an element, a part, a region, a layer and/or a portion from another element, part, region, layer and/or portion. Therefore, in the following discussions, a first element, component, switch, display area, or signal may be called a second element, component, switch, display area, or signal, and do not depart from the teaching of the present disclosure.

The detailed features of the display modules of the present disclosure applied in the display device are respectively described by some embodiments in the following paragraphs.

Figure 1A:
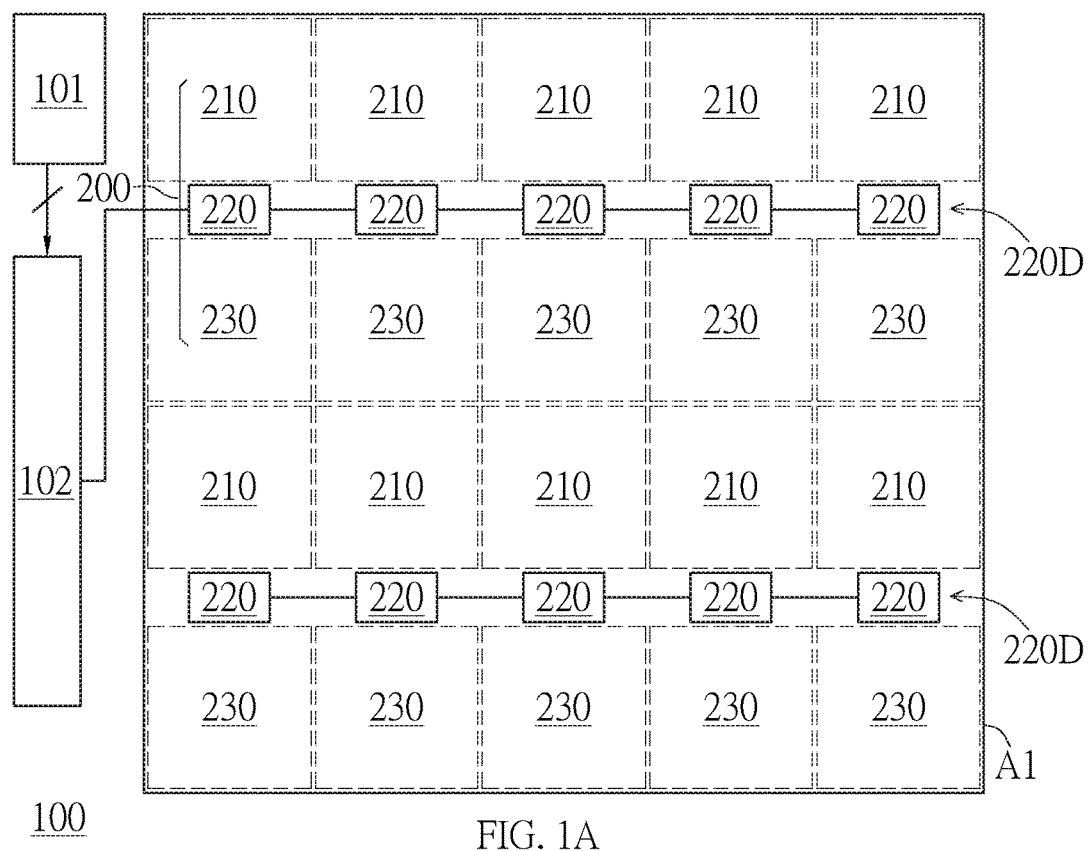
FIG. 1A is a diagram of the display device in the first embodiment of the present disclosure.

Please refer to FIG. 1A, illustrating a diagram of the display device in the first embodiment of the present disclosure.

In the attached FIGS, for the purpose of clarification, the sizes and the thicknesses of layers, films, panels, regions and the like are amplified. In the whole specification, the same marks represent the same element. It should be understood that, when an element such as a layer, a film, a panel, a region or a substrate are described as "being on" or "being connected to" another element, they may be directly on or connected to another element, or there may be other elements therebetween. On the other hand, when an element is described as "being directly existing on" another element or "being directly connected to" another element, there is no element therebetween. As used in the present specification, a "connection" may be a physical and/or electrical connection. In addition, an "electrical connection" or "coupling" means that other elements may exist therebetween.

Please refer to FIG. 1A, in the first embodiment of the present disclosure, a display device 100 includes a plurality of display modules 200. Each of the plurality of display modules 200 has a first display area 210 and a second display area 230, wherein the screen μl is provided by the first display areas 210 and the second display areas 230.

Each of the plurality of display modules 200 includes a driving circuit 220. In each of the plurality of display modules 200, the driving circuit 220 is configured to control the display pixels in the first display area 210 and the second display area 230 at the same time by an independent signal; that is, the display pixels in the first display area 210 and the second display area 230 may receive a driving signal from the driving circuit 220 at the same time. It should be noted that the driving circuit 220 is enlarged in FIG. 1A for the purpose of clarification of the details and connection relationships of the elements in the present embodiment; hence the sizes and the locations thereof do not limit the scope of the present disclosure.

The display device 100 in the present embodiment may, for example, further include an image source 101 and a timing controller 102, wherein the image source 101 may, for example, be a central processing unit (CPU) in the display device 100, or it may also be implemented as an external display card in a host computer, and the present disclosure is not limited thereto.

The present disclosure does not limit the number of display modules constituting the display device. In the first embodiment, the display device 100 may comprise a plurality of display modules 200. However, in another embodiment, the display device 100 may comprise one of the display modules 200. Specifically, in another embodiment of the present disclosure, a screen μl of the display device 100 may, for example, comprise the first display area 210 and the second display area 230 of one of the display modules 200. Please refer to FIG. 1A. In the first embodiment of the present disclosure, the display device 100 comprises a plurality of (tens of, for example) display modules 200. The plurality of display modules 200 are arranged in the display device 100 so as to place the first display area 210 of each of the plurality of display modules 200 in a location corresponding to the first display area 210 or the second display area 230 of another display module 200.

On the other hand, the driving circuits 220 of the plurality of display modules 200 are configured to be connected to each other so as to provide the screen μl by driving the plurality of display pixels together in the present embodiment. Specifically, the driving circuits 220 are connected to each other to form a daisy chain 220D. The plurality of driving circuits 220 are connected through the daisy chain 220D so as to drive the plurality of display pixels in the display device 100.

On the other hand, in the first embodiment of the present disclosure, the driving circuits 220 in each of the display modules 200 are located between the first display area 210 and the second display area 230. The driving circuit 220 may drive the display pixels in the first display area 210 and the second display area 230 at the same time; that is, the driving signals of the display pixels in the first display area 210 and the second display area 230 are independent of each other and may be emitted by the driving circuit 220 at the same time.

Figure 1B:
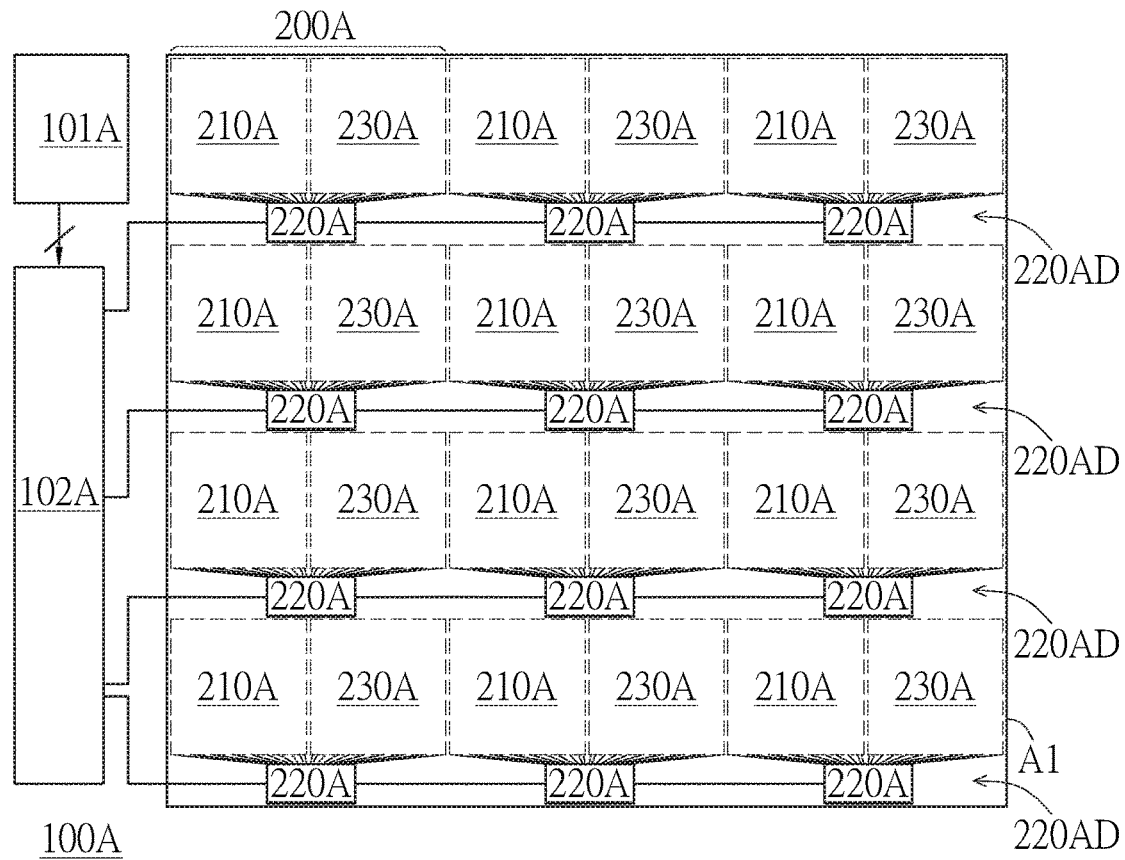
FIG. 1B is a diagram of the display device in another embodiment of the present disclosure.

The display area of the present disclosure is never limited to the aforementioned mode. Please refer to a diagram of the display device 100A in another embodiment illustrated in FIG. 1B. The display device 100A includes the image source 101A, the timing controller 102A and a plurality of display modules 200A. The first display areas 210A and the second display areas 230A of the plurality of display modules 200A are adjacent to each other and arranged to form a combined display area, and the driving circuit 220A is located at one side of the combined display area. In other words, in the embodiment of the present disclosure, the relative locations between the driving circuit and the first display area, the second display area, or even more display areas are not limited.

The display pixels of the display module in the embodiment of the present disclosure are further described in the following paragraphs. People skilled in the art may alter display modules described in the following paragraphs to construct the display device of the aforementioned disposition or the like based on the demand.

Figure 2:
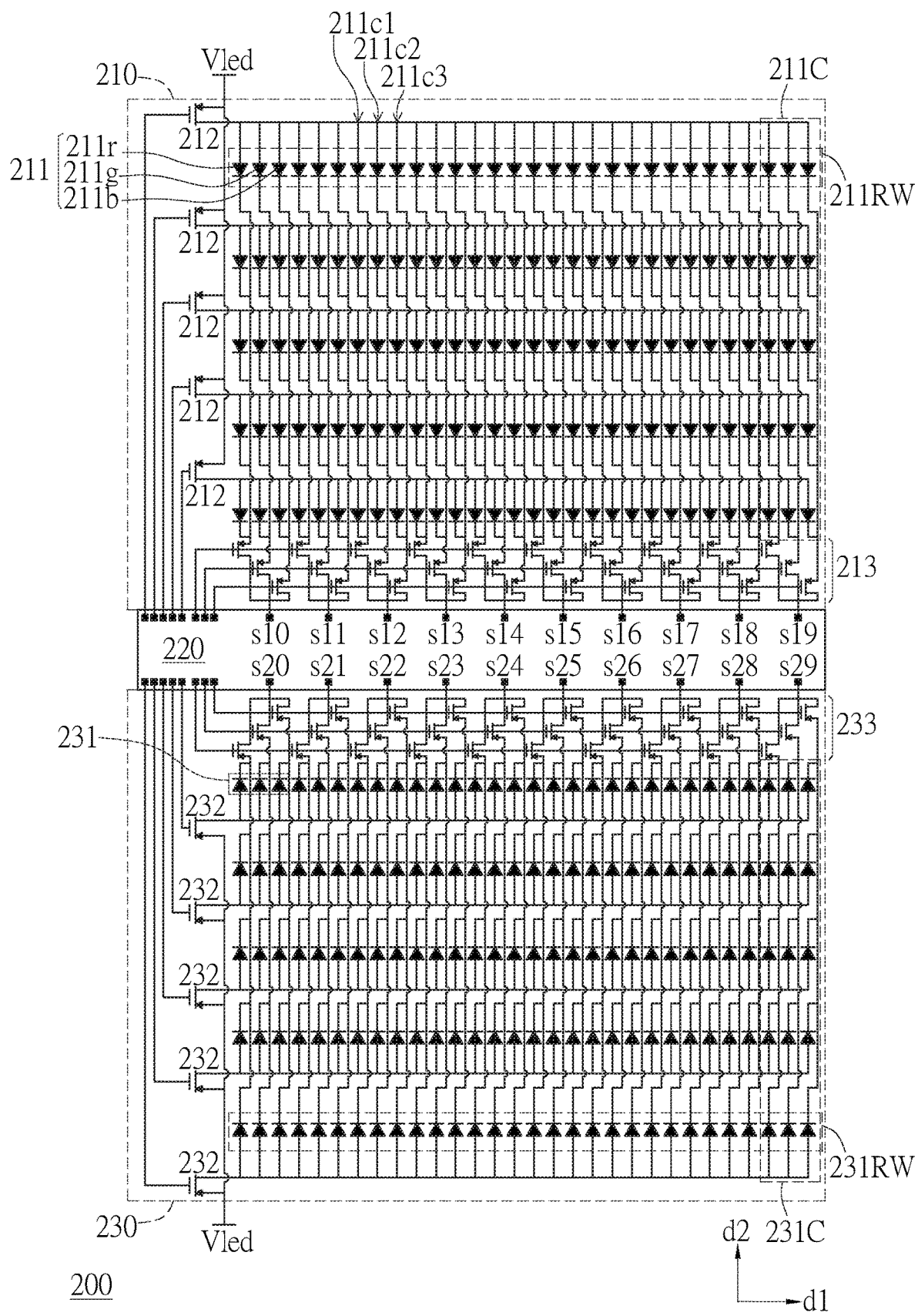
FIG. 2 is a diagram of the display module in the first embodiment of the present disclosure.

FIG. 2 is a diagram of a display module in the first embodiment of the present disclosure. Please refer to FIG. 2. A display module 200 includes a plurality of display pixels 211, wherein each of the display pixels 211 includes sub-pixels 211r, sub-pixels 211g, and sub-pixels 211b. The plurality of display pixels 211 are arranged in columns and rows in the first display area 210; that is, they are arranged along one direction to form a plurality of pixel columns 211C, and arranged along the other direction to form a plurality of pixel rows 211RW. In the present embodiment or another embodiment of the present disclosure, a color space may, for example, be a RGB space. Each of the display pixels 211 consists of a red light, a green light, and a blue light. For example, the sub-pixel 211b may emit a red light; the sub-pixel 211g may emit a green light; and the sub-pixel 211b may emit a blue light. However, the present disclosure is not limited thereto. In another embodiment, different colors may be implemented as base colors of each pixel, sub-pixel or light source based on other types of color spaces.

Specifically, please refer to FIG. 2. A plurality of display pixels 211 of the present embodiment are arranged along a first direction d1 to form a plurality of pixel rows 211 RW, and arranged along the second direction d2 to form a plurality of pixel columns 211C in the first display area 210, wherein the first direction d1 is substantially perpendicular to the second direction d2. Each of the pixel columns 211C includes a plurality of sub-pixel columns 211c1, 211c2, and 211c3, wherein the sub-pixel 211r, 211g, and 211b of the plurality of display pixels 211 are arranged along the second direction d2 in the sub-pixel columns 211c1, 211c2, and 211c3, wherein light emitted from the sub-pixel 211r, 211g, and 211b of each of the sub-pixel columns 211c1, 211c2, and 211c3 are substantially the same in color. For example, the sub-pixel columns 211c1 of the present embodiment are formed of the sub-pixels 211r emitting a red light arranged along the second direction d2; the sub-pixel columns 211c2 are formed of the sub-pixels 211g emitting a green light arranged along the second direction d2; the sub-pixel columns 211c3 are formed of the sub-pixels 211b emitting a blue light arranged along the second direction d2. At the same time, in the display module 200 of the present embodiment, a plurality of pixel rows 231 RW and a plurality of pixel columns 231C are arranged using a display pixel 231 in the second display area 230.

In the present embodiment, the driving circuit 220 provides a plurality of signal connectors s10 to s19, and s20 to s29. Each of the pixel columns 211C or the pixel columns 231C is connected to one of the signal connectors s10 to s19, and s20 to s29.

The display module 200 further includes a plurality of first switches 212 connected to a power source Vled. Using the first display area 210 as an example, each of the first switches 212 is connected between the power source Vled and one of the pixel rows 211 RW to transmit a driving signal, wherein the first switches 212 are controlled by the driving circuit 220. For example, the driving circuit 220 of the present embodiment is connected to gates of the first switches 212, thus the driving circuit 220 may provide a signal to enable the first switches 212 so as to transmit the driving signal between the pixel rows 211RW and the power source Vled. The driving signal may be transmitted from the power source Vled to the plurality of display pixels 211 connected to the pixel rows 211 RW through the first switches 212, and to the signal connectors s10 to s19 of the driving circuit 220 through the pixel columns 211C connected to the display pixel 211 so as to light up the display pixel 211. At the same time, the signal connectors s10 to s19 may be used as current sink to modulate the driving signal.

As mentioned above, the display module 200 may drive the display pixel 211 using the driving circuit 220, and the plurality of display pixels 211 may be arranged in the first display area 210. The driving circuit 220 may further drive the display pixel 211 in the first display area 210 and the display pixel 231 in the second display area 230 at the same time so as to simplify the circuits of the display module 200 and the display device 100 formed of the display module 200.

Specifically, in the embodiments of the present disclosure, the sub-pixel 211r, 211g, and 211b may be formed of light emitting diodes, preferably active light emitting elements such as organic light emitting diode (OLED), mini LED (mLED) or micro LED (μLED).

Terms used here are merely intended to describe the specific embodiment, and never limit the scope of the present disclosure. Except where express instructions are indicated, singular forms such as "a", "one" and "the" are intended to include a plurality of forms, including "at least one". The term "or" represents "and/or". The term "and/or" includes any one or a plurality of combinations of related items. It should be noted that when terms "comprising" and/or "including" are used in the specification, they represent the existence of features, areas, integrations, steps, operations, elements, components and/or combinations thereof, but do not exclude the existence or attachment of one or more additional features, areas, integrations, steps, operations, elements, components and/or combinations thereof.

Specifically, the display module in the first embodiment of the present disclosure further includes a plurality of second switch sets 213, wherein each of the second switches in the plurality of second switch sets 213 is connected to one of the sub-pixel columns 211c1, 211c2, and 211c3, wherein a number of the second switches in the second switch sets 213 to which each of the pixel columns 211C corresponds to a number of the sub-pixels 211r, 211g, and 211b in the display pixel 211. Specifically, using the first embodiment of the present disclosure as an example, the display pixel 211 is formed of the three sub-pixels 211b, 211g, and 211b emitting different lights in colors, therefore the same number (that is, three) of the second switches exist corresponding to each of the pixel columns 211C and respectively connected to one of the sub-pixel columns 211c1, 211c2, and 211c3. On the other hand, the display module 200 also includes a second switch sets 233 having a plurality of second switches corresponding to the second display area 230. These ways of connection are similar to the ones for the aforementioned second switch sets 213, and will not be described here. The features are further described as follows with reference to more detailed diagrams.

Figure 3A:
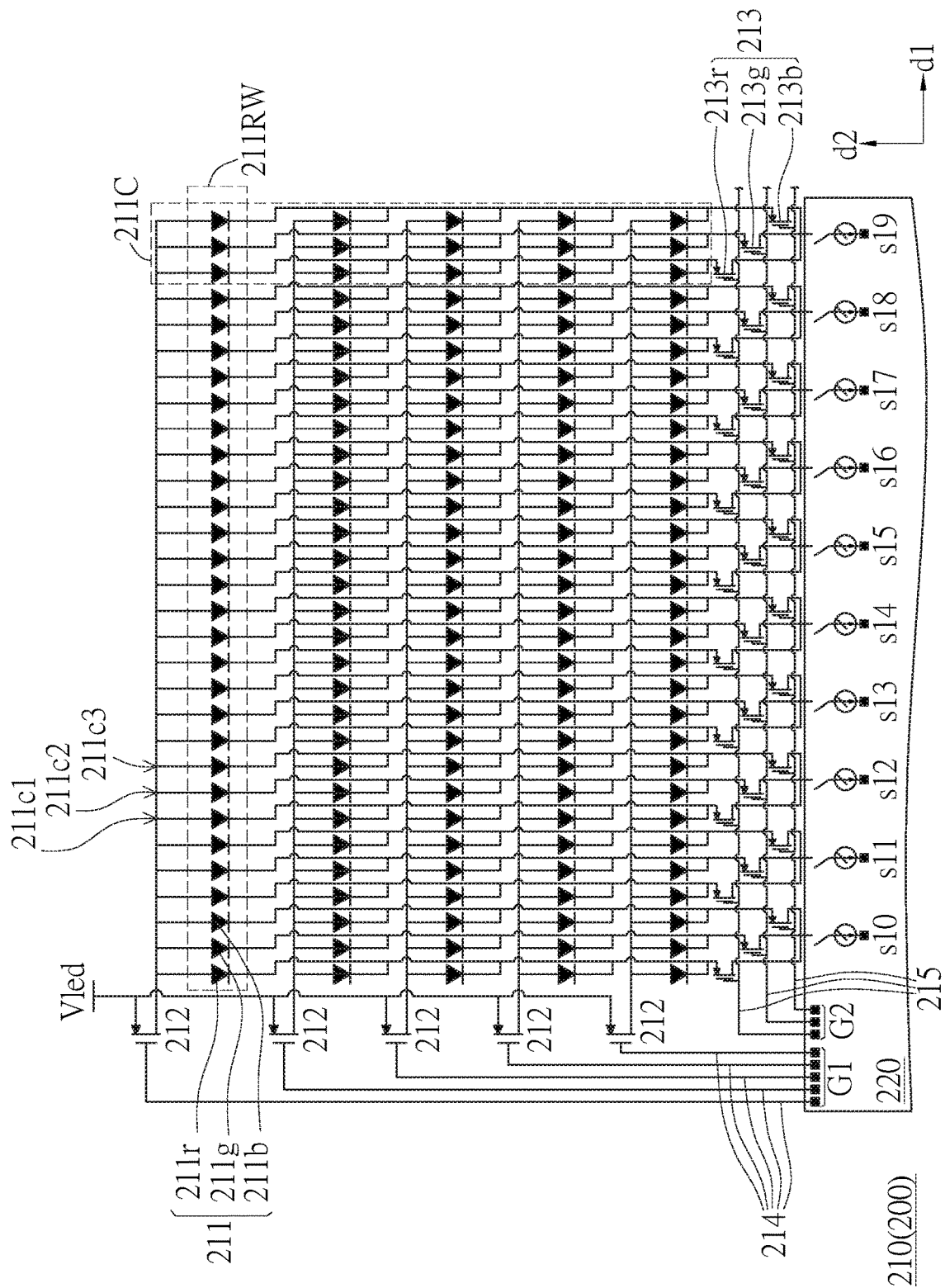
FIG. 3A is a diagram of a first display area of the display module in the first embodiment of the present disclosure.

Please refer to FIG. 3A illustrating a diagram of the first display area 210 and a portion of the driving circuit 220 of the display module 200 in the first embodiment. The second switch sets 213 of the display module 200 include second switches 213r, 213g, and 213b, wherein light emitting pixels in the sub-pixels columns 211c1 connected to the second switches 213r emit a red light; light emitting pixels in the sub-pixel columns 211c2 connected to the second switches 213g emit a green light; light emitting pixels in the sub-pixel columns 211c3 connected to the second switches 213b emit a blue light.

In the present embodiment, the driving circuit 220 may further sequentially transmit a first gate signal through a gate contact G1 so as to sequentially turn on the first switches 212. The display module 200 of the present embodiment further includes a plurality of signal lines 214 extending substantially along the second direction d2. The plurality of first signal lines 214 are connected to the gate contact G1 of the driving circuit 220. The first gate signal is sequentially transmitted to the gates of the first switches 212 through a plurality of first signal lines 214 to enable the first switches 212.

In each of the pixel columns 211C, the driving circuit 220 of the present embodiment sequentially transmits a second gate signal through the gate contact G2 so as to sequentially turn on the second switch 213r, the second switch 213b and the second switch 213g. The display module 200 further includes a plurality of second signal lines 215 extending substantially along the first direction d1. The plurality of second signal lines 215 are connected to the gate contact G2 of the driving circuit 220. The second gate signal is sequentially transmitted to gates of the second switches 213r, 213g, and 213b through the plurality of second signal lines 215 to enable the second switches 213r, 213g, and 213b.

On the other hand, the driving circuit 220 in the first embodiment of the present disclosure may further control the driving signal to be transmitted as a constant current through the signal connectors s10 to s19 so that electric quality of the signal is stable. In another embodiment, the driving circuit 220 may also further control the light emitting time of the display pixel using a pulse modulation signal so as to emit lights with higher resolution grayscale. The features are further described as follows with reference to a signal diagram as follows.

Figure 3B:
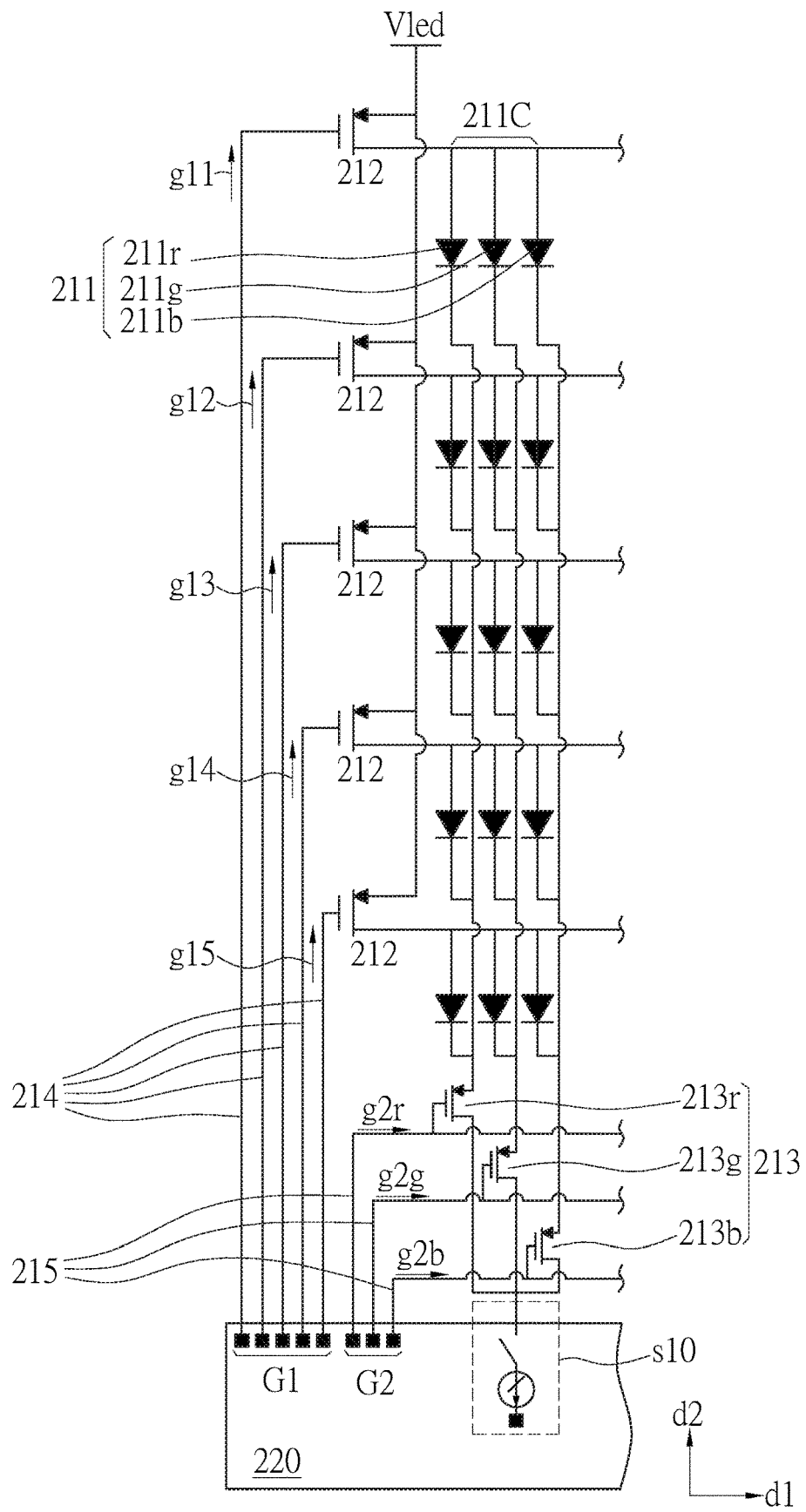
FIG. 3B is a diagram of a pixel column in the first embodiment of the present disclosure.

Please refer to FIG. 3B illustrating a diagram of pixel columns and a portion of the display module. When the driving circuit 220 transmits a first gate signal g11 through the gate contact G1 to turn on one of the first switches 212, the driving circuit 220 transmits the second gate signal g2r through the gate contact G2 to enable the second switches 213r so that the driving signal may be transmitted. At that time, the driving circuit 220 may control the driving signal to be transmitted as a constant current through the signal connectors s10, and may also further control the driving signal transmitted as a pulse modulation signal through the signal connectors s10 so that the display pixel may be displayed with an enhanced grayscale. As illustrated in FIG. 3B, the signal connector s10 may be along with intervening circuit elements including a switch, the other signal connectors s11 to s19, and s20 to s29 may also have the same or similar structure as the signal connector s10; however, the structure of the signal connectors s10 to s19, and s20 to s29 are not limited thereto and may have other structures such as a simple terminal.

When the first gate signal g11 turns on the first switches 212, the second gate signals g2r, g2g, and g2b may sequentially turn on the second switches 213r, 213g, and 213b so as to enable the driving signal to sequentially light up the sub-pixels 211b, 211g, and 211b.

Through the aforementioned steps, the display module may further sequentially transmit the first gate signals g12, g13, g14, and g15 so as to sequentially turn on the display pixels in the different pixel rows, and to sequentially turn on the second switches 213r, 213g, and 213b to display a screen during the time the first switches 212 of each of the pixel rows are turned on.

It should be especially noted that the second switches 213r, 213g, and 213b may be turned on and off many times during the time the first switches 212 are turned on, and the second gate signal may also be a pulse modulation signal so as to further control the grayscale of the screen.

Figure 4A:
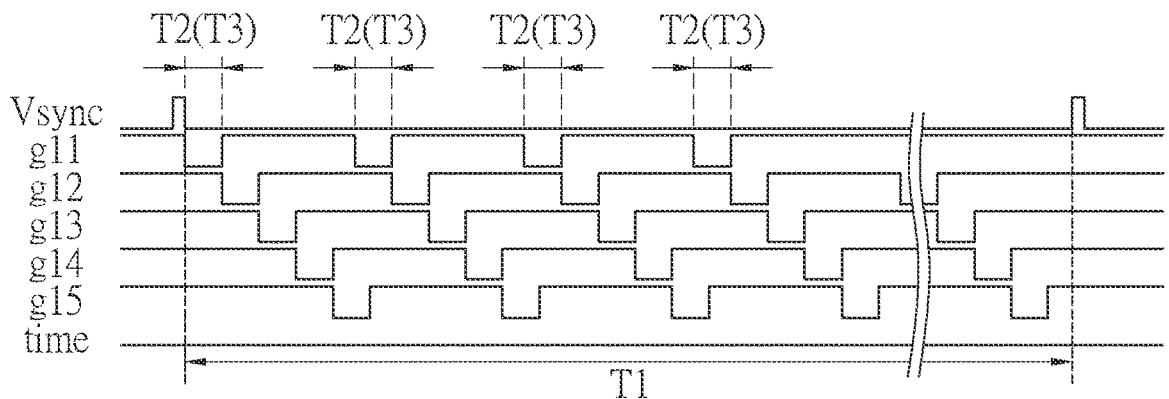
FIG. 4A is a signal diagram of the display module in the first embodiment of the present disclosure.
Figure 4B:
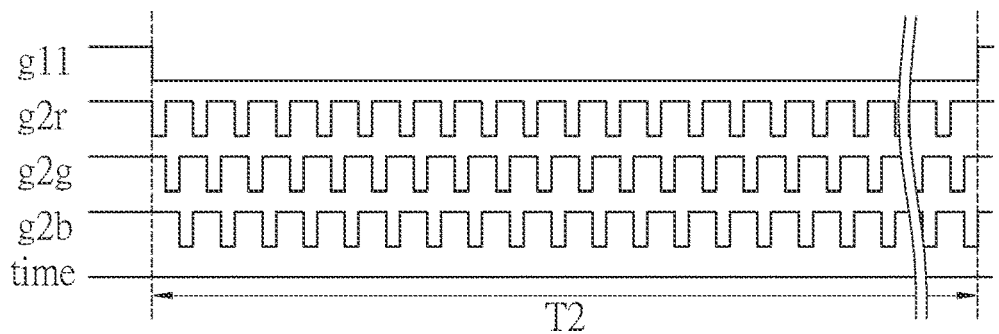
FIG. 4B is a signal diagram of the display module in another embodiment of the present disclosure.

FIG. 4A and FIG. 4B are signal diagrams of the display module in the first embodiment of the present disclosure. Please refer to FIG. 4A. During the display period T1 of a picture frame, that is, during the period T1 of a screen (time intervals between the vertical synchronization pulses (Vsync)), the first gate signals g11 to g15 sequentially turn on the first switches at a first frequency so as to sequentially turn on each of the first switches connected to the pixel rows.

Please refer to FIG. 4B. Taking the first gate signal g11 as an example, during the period T2 in which the first gate signal g11 is turned on, the second gate signals g2r, g2g, and g2b sequentially turn on the second switches to sequentially light up the pixel rows. Corresponding to a time of the plurality of second gate signals g2r, g2g, and g2b, the aforementioned driving circuit correspondingly controls the driving signal through the signal connectors (not illustrated) so that the display pixel may show different colors through the second gate signal g2r, g2g, and g2b and the driving signal during each of the periods T2 in which the first gate signal g11 turns on the first switches.

Taking the embodiment illustrated in FIG. 4A as an example, during the display period of a picture frame, the first gate signals g11 to g15 are sequentially turned on 64 times (that is $2^6$ times). Please refer to FIG. 4B again. During each of the periods T2 of the first gate signal g11, the second gate signals g2r, g2g, and g2b are respectively turned on 64 times (that is $2^6$ times) again, thus $64^2=2^{12}=4096$ combinations may be provided. Through the first gate signal and the second gate signal, the driving signal is transmitted as a constant current through the signal connectors s10, s11, and s12 during a suitable period, thus the display module of the present embodiment may provide a display effect of high resolution grayscale.

Figure 4C:
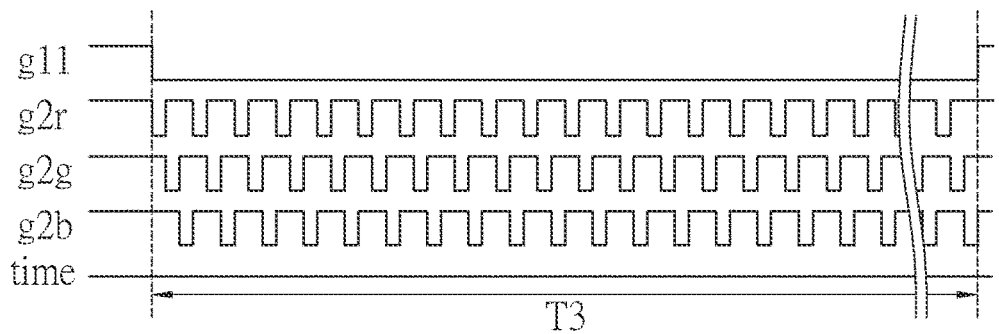
FIG. 4C is a signal diagram of the display module in another embodiment of the present disclosure.

However, the present disclosure is not limited thereto. Please refer to FIG. 4C illustrating a diagram of the driving signal in another embodiment. During the period T3 in which the first gate signal g11 is turned on, the second gate signals g2r, g2g, and g2b may be turned on at a second frequency. During each of the periods in which the second gate signals g2r, g2g, and g2b turn on the second switches, the driving signal controlled by the signal connectors (not illustrated) is transmitted as the pulse modulation signal so as to enhance the grayscale of the screen. In other words, during each period in which the second gate signals g2r, g2g, and g2b turn on the second switches, the signal connectors may further enhance grayscale using the pulse modulation signal.

Taking the embodiment illustrated in FIG. 4C as an example, during the display period of a picture frame, the first gate signals g11 to g15 are sequentially turned on 64 times. During each period T3 of the first gate signal g11, the second gate signals g2r, g2g, and g2b may be respectively turned on 64 times. The signal connectors (not illustrated) are driven by $2^6$ types of pulse modulation signal, therefore $2^{18}$ combinations may be provided so as to provide a display effect with higher resolution grayscale.

In summary, the display module provided by the present disclosure may control the display pixels in a plurality of display areas. The driving method of the present disclosure may drive the module using a high resolution grayscale method so that the screen has high resolution grayscale at the same time. The display device provided by the present disclosure may comprise a plurality of display modules, and the driving circuits of the plurality of display modules may be connected to each other so as to simplify the circuits and to display the screen with high resolution grayscale.

The terms "about", "approximate" or "essentially" used in the present specification include the value itself and the average values within the acceptable range of deviation of the specific values confirmed by a person having ordinary skill in the present art, considering the specific measurement discussed and the amount of errors related to such measurement (that is, the limitation of the measurement system). For example, "about" may mean within one or more standard deviations of the value itself, or within ±30%, ±20%, ±10%, ±5%. In addition, "about", "approximate" or "essentially" used in the present specification may select a more acceptable range of deviation or standard deviation based on optical property, etching property or other properties. One cannot apply one standard deviation to all properties.

If not defined specifically, all terms in the specifications (including terms about technology and science) have the same meaning as those understood by those who have ordinal skill in the art. It should be further understood that, for example, the terms defined in commonly used dictionaries should be interpreted as having a meaning that is consistent with their meaning in the context of the relevant art and the present disclosure, and should not be interpreted in an idealized or overly formal sense unless expressly so defined herein.

Exemplary embodiments are described with reference to sectional drawings of diagrams of reasonable embodiments in the present specification. Therefore, it is possible to expect shape variations treated and illustrated as results of production technologies and/or tolerance etc. Therefore, the embodiments in the specification should not be intended to limit to the specific form described in the specification, and include shape deviations for example generated by production process. For example, described or illustrated flat areas may have roughs and/or non-linear features. In addition, illustrated acute angles may be round angles. Therefore, the illustrated areas are essentially used as examples, and shapes thereof are not accurate shapes of illustrated areas, and not intended to limit the scope of the present disclosure.

What is claimed is:

1. A display module, comprising:
   a plurality of display pixels arranged in columns and rows in a display area, each of the display pixels comprising a plurality of sub-pixels;
   a driving circuit comprising a plurality of signal connectors; and
   a plurality of first switches electrically connected to the driving circuit; and
   a plurality of second switches,
   wherein the display pixels are arranged along a first direction to form a plurality of pixel rows and arranged along a second direction to form a plurality of pixel columns, and the first direction and the second direction are substantially perpendicular;
   each of the pixel columns comprises a plurality of sub-pixel columns, and the sub-pixels of the display pixels are arranged along the second direction to form the sub-pixel columns, and lights emitted from the sub-pixels of each of the sub-pixel columns are substantially same in color;
   the plurality of second switches are respectively connected to one of the sub-pixel columns, the sub-pixel columns of each of the pixel columns are respectively connected to the signal connectors to which the pixel column corresponds through one of the second switches;
   each of the pixel columns is connected to one of the signal connectors, each of the first switches is connected between a power source and one of the pixel rows, and the first switches are controlled by the driving circuit;
   when the driving circuit enables one of the first switches, and one of the display pixels of the pixel row connected to the one of the first switches receives a driving signal, the driving signal is transmitted between the power source and one of the signal connectors along the pixel column in which the one of the display pixels are arranged, wherein:
   the driving circuit is configured to repeatedly transmit a first gate signal from the driving circuit at a first frequency to sequentially enable the first switches; and
   the driving circuit transmits a second gate signal from the driving circuit at a second frequency to repeatedly enable or disable the second switches during a period in which the first gate signal enables one of the first switches.

2. The display module according to claim 1, wherein the sub-pixels of the display pixels are respectively formed by an active light-emitting element.

3. The display module according to claim 1, wherein the display area comprises:
   a first display area, a portion of the display pixels are arranged in columns and rows in the first display area; and
   a second display area, others of the display pixels are arranged in columns and rows in the second display area;
   wherein the driving circuit is disposed between the first display area and the second display area; the driving circuit is configured to control the display pixels in the first display area and the second display area at the same time by independent signals.

4. The display module according to claim 1, further comprising:
   a plurality of first signal lines, each of the first signal lines configured to connect one of the first switches to the driving circuit, the first signal lines configured to transmit the first gate signal to enable the first switches; and
   a plurality of second signal lines, each of the second signal lines connecting one of the second switches to the driving circuit, the second signal lines configured to transmit the second gate signal to enable the second switches.

5. The display module according to claim 4, wherein:
   the driving circuit is configured to transmit the first gate signal at the first frequency during a period in which the display module displays a pixel frame; and
   in each of the pixel columns, the driving circuit repeatedly transmits the second gate signal to sequentially turn on the second switches.

6. The display module according to claim 1, wherein the driving circuit is configured to control the driving signal to be transmitted as a constant current through the signal connectors.

7. The display module according to claim 1, wherein the driving circuit is configured to control the driving signal to be transmitted as a pulse modulation signal through the signal connectors during a period in which each of the second switches is turned on.

8. The display module according to claim 1, wherein the driving circuit is configured to be connected to a driving circuit of another display module, so that the display pixels of the display modules construct a display screen.

9. A display device configured to provide a screen, the display device comprising:
   a plurality of display modules respectively comprising a display area, the display areas of the display modules constructing the screen;
   each display module comprising:
   a plurality of display pixels, arranged in columns and rows in the display area, each of the display pixels comprising a plurality of sub-pixels;
   a driving circuit, comprising a plurality of signal connectors;
   a plurality of first switches, electrically connected to the driving circuit; and
   a plurality of second switches,
   wherein the display pixels are arranged along a first direction to form a plurality of pixel rows, and arranged along a second direction to form a plurality of pixel columns, and the first direction and the second direction are substantially perpendicular;
   each of the pixel columns comprises a plurality of sub-pixel columns, and the sub-pixels of the display pixels are arranged along the second direction to form the sub-pixel columns, and lights emitted from the sub-pixels of each of the sub-pixel columns are substantially the same in color;
   the plurality of second switches are respectively connected to one of the sub-pixel columns, the sub-pixel columns of each of the pixel columns are respectively connected to the signal connectors to which the pixel column corresponds through one of the second switches;
   each of the pixel columns is connected to one of the signal connectors, each of the first switches is connected between a power source and one of the pixel rows, and the first switches are controlled by the driving circuit;
   when the driving circuit enables one of the first switches, and one of the display pixels of the pixel row connected to the one of first switches receives a driving signal, the driving signal is transmitted between the power source and one of the signal connectors along the pixel column in which the one of the display pixels is arranged;
   the driving circuit is configured to repeatedly transmit a first gate signal from the driving circuit at a first frequency to sequentially enable the first switches; and
   the driving circuit transmits a second gate signal from the driving circuit at a second frequency to repeatedly enable or disable the second switches during a period in which the first gate signal enables one of the first switches,
   wherein the driving circuits of the display modules are connected to each other.

10. The display device according to claim 9, wherein the driving circuits of the display modules are connected by daisy chain.

11. The display device according to claim 9, wherein the sub-pixels of the display pixels are respectively formed by an active light-emitting element.

12. The display device according to claim 9, wherein in each of the display modules, the display area comprises:
   a first display area, a portion of the display pixels are arranged in columns and rows in the first display area; and
   a second display area, others of the display pixels are arranged in columns and rows in the second display area;
   the driving circuit is disposed between the first display area and the second display area, the driving circuit is configured to control the display pixels in the first display area and the second display area by independent signals at the same time.

13. The display device according to claim 9, wherein each of the display modules further comprises:
   a plurality of first signal lines, each of the first signal lines connects one of the first switches to the driving circuit, the first signal lines configured to transmit the first gate signal to enable the first switches; and
   a plurality of second signal lines, each of the second signal lines connecting one of the second switches to the driving circuit, the second signal lines configured to transmit the second gate signal to enable the second switches.

14. The display device according to claim 13, wherein:
   the driving circuit is configured to transmit the first gate signal at the first frequency during a period in which the display module displays a pixel frame;
   in each of the pixel columns, the driving circuit repeatedly transmits the second gate signal and respectively turns on the second switches.

15. The display device according to claim 9, wherein the driving circuit of each of the display modules is configured to control the driving signal to be transmitted as a constant current through the signal connectors.

16. The display device according to claim 9, wherein the driving circuit of each of the display modules is configured to control the driving signal to be transmitted as a pulse modulation signal through the signal connectors during a period in which each of the second switches are turned on.

17. A driving method, comprising:
   transmitting a first gate signal at a first frequency, the first gate signal configured to turn on a plurality of first switches in a display module; and
   controlling transmission of a driving signal in a plurality of sub-pixel columns by transmitting a second gate signal at a second frequency so as to repeatedly enable or disable a plurality of second switches during a period in which each of the first switches is turned on;
   wherein the display module comprises a plurality of display pixels arranged in columns and rows in a display area, a driving circuit, and the plurality of first switches;
   each of the display pixels comprises a plurality of sub-pixels, the display pixels are arranged along a first direction to form a plurality of pixel rows and arranged along a second direction to form a plurality of pixel columns, each pixel columns comprises a plurality of sub-pixel columns, sub-pixels of the display pixels are arranged along the second direction to form the sub-pixel columns, color of the light emitted from sub-pixels of each sub-pixel columns is substantially the same in color, and the first direction and the second direction are substantially perpendicular; so that the plurality of second switches are respectively connected to one of the sub-pixel columns, the sub-pixel columns of each of the pixel columns are respectively connected to the signal connectors to which the pixel column corresponds through one of the second switches;

the driving circuit comprises a plurality of signal connectors, each of the pixel columns is connected to one of the signal connectors;

each of the first switches is connected between a power source and at least one of the pixel rows, and the first switches and the second switches are controlled by the driving circuit;

when one of the first switches is turned on and one of the display pixels of the pixel row connected to the first switches receives the driving signal, the driving signal may be transmitted between the power source and one of the signal connectors along the pixel column in which the one of the display pixels is arranged.

18. The driving method according to claim 17, wherein the second gate signal turns on one of the plurality of second switches at the second frequency and the signal connectors are configured to adjust the driving signal as a pulse modulation signal during a period in which each of the first gate signal turns on one of the first switches;

the second switches are respectively connected to one of the sub-pixel columns, and the sub-pixel columns of each of the pixel columns are respectively connected to the signal connectors to which the pixel column corresponds through one of the second switches.

19. The driving method according to claim 18, further comprising:

transmitting the driving signal to each of the sub-pixel columns as a pulse modulation signal during a period in which one of the second switches is turned on by the second gate signal.

20. The driving method according to claim 17, wherein the signal connectors are configured to enhance grayscale using a pulse modulation signal during a period in which the second gate signal sequentially enables the second switches at the second frequency.

\* \* \* \* \*